US006730968B1

(12) United States Patent
Wu et al.

(10) Patent No.: US 6,730,968 B1
(45) Date of Patent: May 4, 2004

(54) WHOLE CHIP ESD PROTECTION

(75) Inventors: Yi-Hsu Wu, Hsin-Chu (TW);
Jian-Hsing Lee, Hsin-Chu (TW);
Shui-Hung Chen, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/205,520

(22) Filed: Jul. 25, 2002

(51) Int. Cl.$^7$ ................................................ H01L 23/62
(52) U.S. Cl. ........................ 257/355; 257/355; 257/173
(58) Field of Search ................... 257/355, 173, 257/174, 297, 365; 361/56, 111; 438/661

(56) References Cited

U.S. PATENT DOCUMENTS

| | | | |
|---|---|---|---|
| 5,623,156 A | * 4/1997 | Watt ............................ | 257/355 |
| 6,218,704 B1 | 4/2001 | Brown et al. ................ | 257/355 |
| 6,262,873 B1 | 7/2001 | Pequignot et al. ........... | 361/111 |
| 6,344,412 B1 | 2/2002 | Ichikawa et al. ............ | 438/661 |
| 6,583,972 B2 * | 6/2003 | Verhaege et al. ............. | 361/56 |

* cited by examiner

Primary Examiner—David Nelms
Assistant Examiner—Thinh T Nguyen
(74) Attorney, Agent, or Firm—George O. Saile; Stephen B. Ackerman

(57) ABSTRACT

This invention provides two circuit embodiments for a whole chip electrostatic discharge, ESD, protection scheme. It also includes a method for whole chip ESD protection. This invention relates to distributing the circuit of this invention next to each input/output pad in order to provide parallel ESD current discharge paths. The advantage of this invention is the ability to create a parallel discharge path to ground in order to discharge the damaging ESD current quickly so as to avoid circuit damage. The two circuit embodiments show how the protection circuits of this invention at both the unzapped I/O pads and the zapped I/O pad are connected in a parallel circuit for discharging ESD currents quickly. These protection embodiments require a small amount of semiconductor area, since the smaller protection circuits are distributed and placed at the locations of each I/O pad.

12 Claims, 3 Drawing Sheets

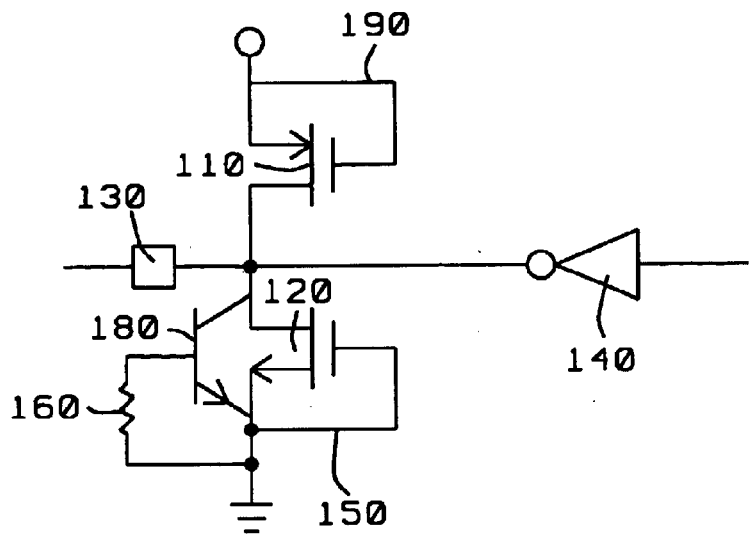
FIG. 1 - Prior Art
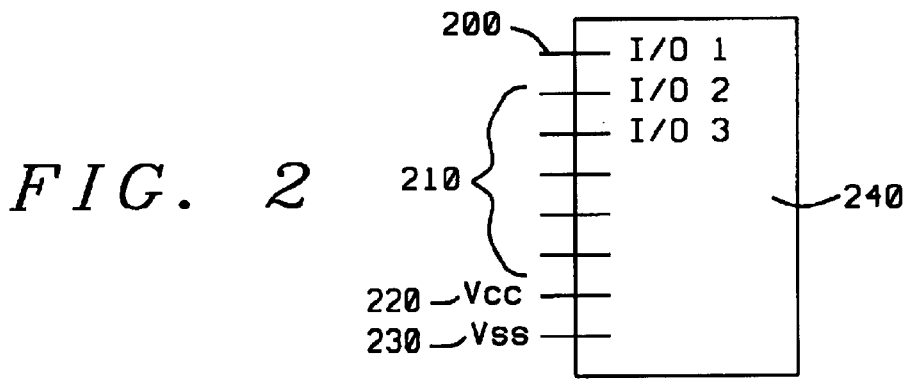
FIG. 2
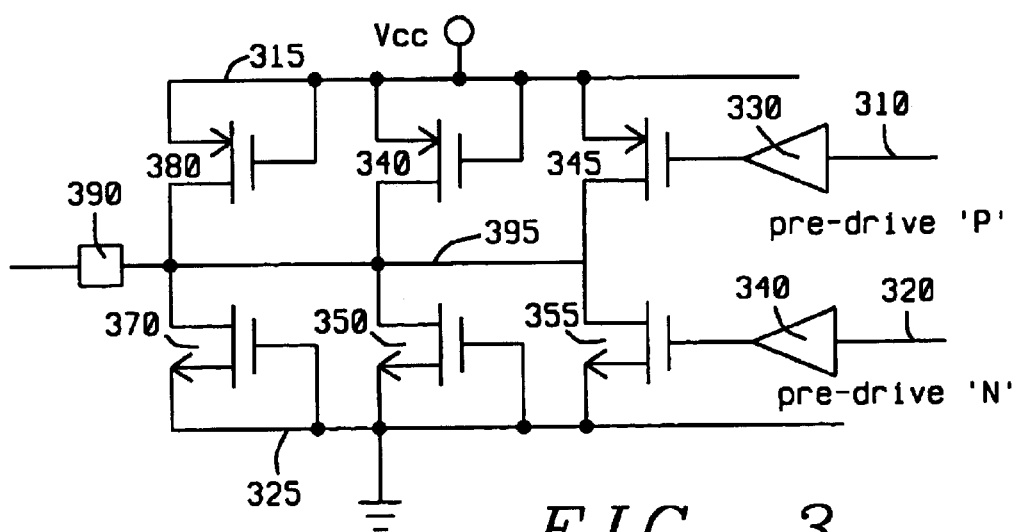
FIG. 3

WHOLE CHIP ESD PROTECTION

BACKGROUND OF THE INVENTION

1. Field of the Invention

This invention relates to a whole chip electrostatic discharge, ECD, circuit and method.

In particular, this invention relates to distributing the circuit of this invention next to each input/output pad in order to provide parallel ESD current discharge paths.

2. Description of Related Art

FIG. 1 shows a prior art input/output protection circuit. This protection circuit is placed next to each input/output (I/O) pad. Each protection circuit, like the one shown in FIG. 1, is used to protect only one I/O pad. If one of the I/o pads is zapped with high voltage or high current, the electrostatic discharge, ESD, current 170 only flows through the protection circuit adjacent to the zapped I/o pad. The circuit in FIG. 1 is connected to the supply voltage Vcc 190 and to Vss 150 or ground. The circuit includes a p-channel metal oxide semiconductor field effect transistor PMOS FET device 110 and an n-channel metal oxide semiconductor field effect transistor NMOS FET device 120. It also includes a bipolar junction transistor 180 and a resistor 160.

U.S. Pat. No. 6,344,412 (Ichikawa, et al.) "An Integrated ESD protection method and system" describes a method and a system for protecting integrated circuits from electrostatic discharge damage.

U.S. Pat. No. 6,262,873 (Pequignot, et al.) "A Method for Providing ESD Protection for an Integrated Circuit" discloses a method for providing electrostatic protection for integrated circuits.

U.S. Pat. No. 6,218,704 (Brown, et al.) "ESD Protection Structure and Method" discloses an integrated circuit structure and method for electrostatic discharge protection for chips.

BRIEF SUMMARY OF THE INVENTION

It is the objective of this invention to provide a whole chip electrostatic discharge, ECD, circuit and method.

It is further an object of this invention to provide a means of distributing the circuit of this invention next to each input/output pad in order to provide parallel ESD current discharge paths.

The objects of this invention are achieved by a whole chip electrostatic discharge, ECD, first embodiment circuit made up of a PN diode whose p-side connects to the input/output, I/O pad to be protected and whose N-side is connected to Vcc supply voltage, a PMOS FET plus NMOS FET 2-device input stage connected between Vcc and Vss, a resistor plus NMOS FET first mid stage connected between Vcc and Vss (ground). The circuit of the invention also contains a resistor to ground second mid-stage, and a PMOS FET plus NMOS FET output stage connected between Vcc and Vss (ground) whose input connects from the mid stages and whose output drives an unused I/O pad.

The objects of this invention are further achieved by a whole chip electrostatic discharge ECD method comprising the steps of connecting all input/output, I/O pads to each other with double isolation, and inserting a circuit of the first embodiment of this invention between each adjacent I/O pair on a semiconductor chip.

BRIEF DESCRIPTION OF THE DRAWINGS

FIG. 1 shows a prior art input/output protection circuit.
FIG. 2 shows a block diagram of an integrated circuit with the input/output pins.
FIG. 3 shows parallel circuit example of this invention.

DETAILED DESCRIPTION OF THE INVENTION

Figure 4:
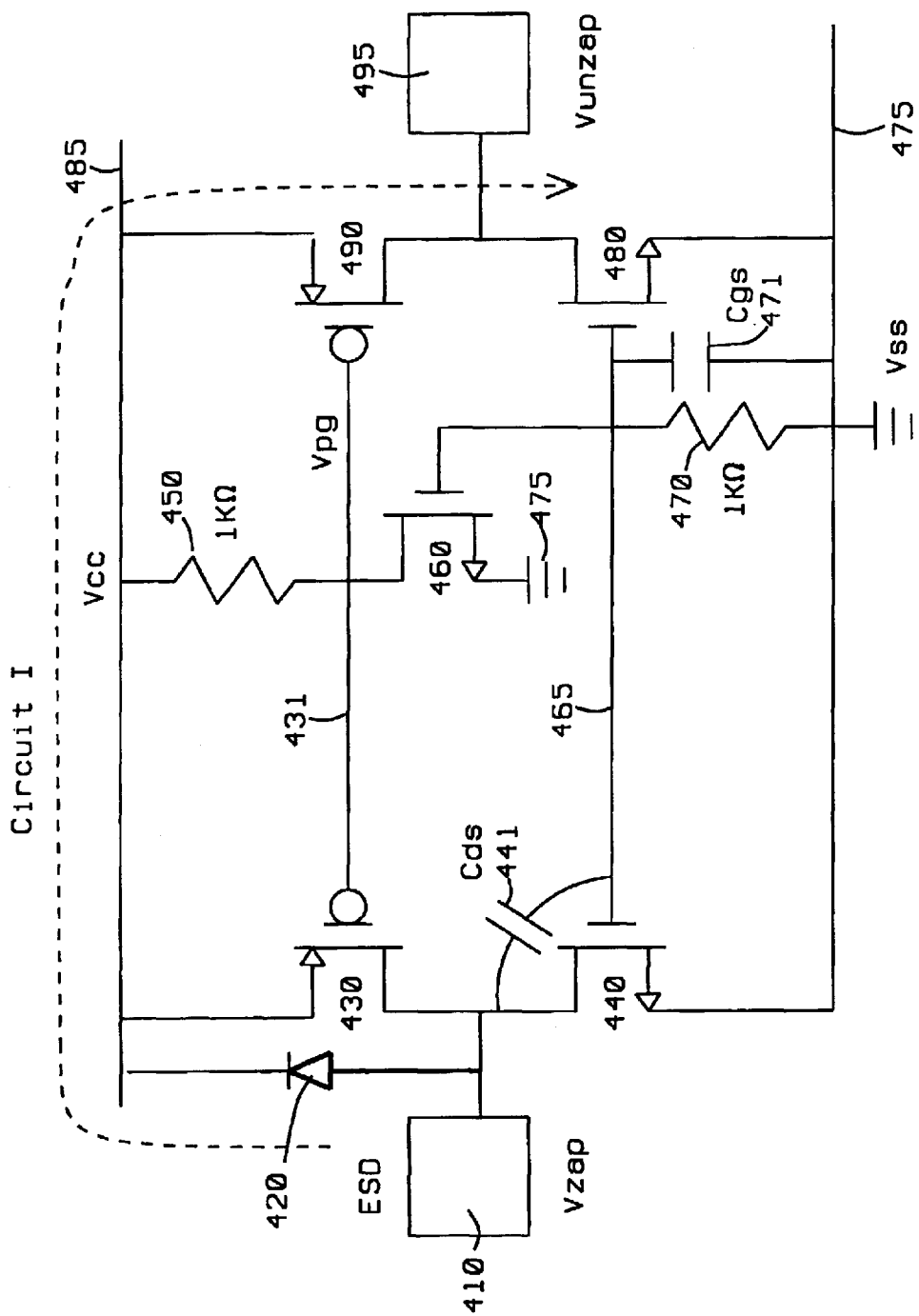
FIG. 4 shows circuit embodiment #1 of this invention.

FIG. 2 shows block diagram which represents an integrated circuit 240 with several input/output (I/O) pins 200, 210. Pin 200 is the pin under test or the zapped pin with either a high voltage or high current. The non-zapped I/O pin 210 is also shown. In this invention, all of the pins or I/o pads have the protection circuit of this invention adjacent to them. When one of the I/O pads is zapped such as pin 200 in FIG. 2, all of the protection circuit associated with all of the I/O pads 200, 200 including the zapped and unzapped I/O pads participate in a parallel circuit combination which greatly improves the whole chip ESD protection.

FIG. 3 shows an example of the composite parallel circuit which results when an I/O pad is zapped. The zapped I/O pad is shown 390. Devices 380 and 370 are from the ESD protection circuit adjacent to the zapped I/o pad 390. Devices 340 and 350 are from an unzapped I/O pad. Similarly devices 345 and 355 are from another unzapped I/O pad. Node 395 is the common discharge mode shared by the parallel connection of these I/O protection circuits. Node 315 is the shared Vcc power supply node for all of the I/O protection circuits. Node 325 is the shared ground node for all of the I/O protection circuits. Blocks 330 represents pre-drive for the first PMOS FET device 345 in the parallel protection circuit of FIG. 3. Similarly, block 340 represents a pre-driver for the first NMOS FET device 355 in the parallel protection circuit of FIG. 3. Also shown in FIG. 3 are the pre-drive P control signal 310 and the pre-drive N control signal 320. FIG. 4 shows the first embodiment circuit of this invention. The zapped I/O pad 410 is the pad, which has an abnormally high voltage or current. The first embodiment circuit of this invention is made up of PMOS FET device 430 whose drain is connected to the zapped I/O 410. There are actually several PMOS FETs like 430 connected in parallel. The source of the PMOS FET device 430 is connected to the Vcc power supply. The gate of the PMOS FET device 430 is connected with the Vpg common 'p' node, which is shared by all of the parallel connected protection circuits of this invention. Device 430 is normally off during normal operations when there is no ESD high voltage or high current situation.

FIG. 4 also shows NMOS FET device 440 whose source is connected to Vss or ground 475 and whose drain is connected to the zapped I/O pad 410. There are actually several NMOS FETs like 440 connected in parallel. The gate of the NMOS FET device 440 is connected to the Vng common 'N' node, which is shared by all of the parallel connected protection circuits of this invention. Device 440 is normally off during normal operations when there is no ESD high voltage or high current situation.

FIG. 4 also shows a PN diode 420 whose p-side is connected to the zapped I/O pad 410 & whose N side is connected to the Vcc power supply 485. The PN diode 420 conducts only when the voltage at the I/O pad 410 exceeds Vcc and Vbe where Vbe is a diode voltage drop of about 0.7 volts. The voltage at a zapped I/O pin 410 is clamped to Vcc and Vbe. During this high voltage clamped state NMOS FET device 440 is 'ON' and conducting ESD current to ground. Node 465 is high due to AC current through the 1 kilohm resistor 470, coupling from node 410 to node 465 via Cds 441 and NMOS device 440. Node 465 goes high and stays high for a time period since the parasitic capacitance Cgs 471 of NMOS FET device 480 charges up. This charged up high voltage turns on NMOS device 460 which provides another parallel path for ESD current to flow to ground via the 1 kilohm resistor 450. This current flow through the turned on NMOS FET 460 to ground 475 produces a low level at the Vpg node. The low level at node Vpg 431 turns on PMOS FET 490. In addition, the previously mentioned current flow through the 1 kilo ohm resistor 470 causes a high voltage level at the Vng node 465. This high level at Vng 465 turns on the NMOS FET 480. Therefore a third parallel ESD current discharge path to ground is established through devices 490 and 480. Nodes Vpg and Vng are nodes which are shared by all of the parallel ESD protection circuits like the one in FIG. 4. All of the ESD protection circuits associated with the unzapped I/O pads provide several parallel paths to ground for the ESD current to discharge. This quick discharging of the ESD current to ground protects the whole chip from ESD overcurrent damage.

In summary, a positive ESD voltage spike causes the capacitive charging of Vng to turn on both PMOS 430 and NMOS 440 devices in the zapped and unzapped protection circuits. A negative ESD voltage spike is clamped by the PN diode 420 at the zapped I/O pin. The PMOS 430 and NMOS 440 devices are off and the unzapped protection circuits are off.

Figure 5:
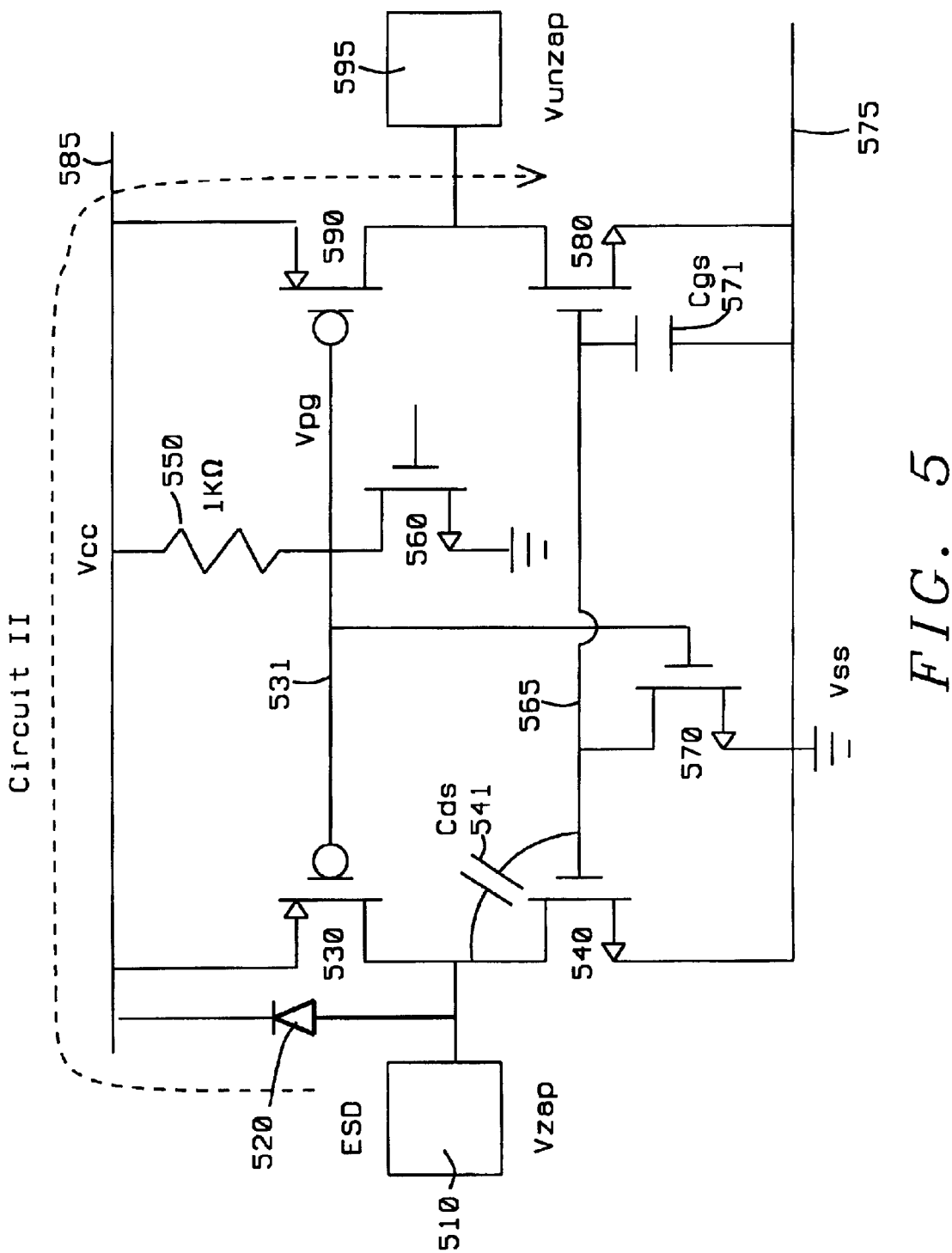
FIG. 5 shows circuit embodiment #2 of this invention.

FIG. 5 shows the second embodiment circuit of this invention. The zapped I/O pad 510 is the pad, which has an abnormally high voltage or current. The first embodiment circuit of this invention is made up of PMOS FET device 530 whose drain is connected to the zapped I/O 510. The source of the PMOS FET device 530 is connected to the Vcc power supply. The gate of the PMOS FET device 530 is connected with the Vpg common 'p' node, which is shared by all of the parallel connected protection circuits of this invention. Device 530 is normally off during normal operations when there is no ESD high voltage or high current situation.

FIG. 5 also shows NMOS FET device 540 whose source is connected to Vss or ground 575 and whose drain is connected to the zapped I/O pad 510. The gate of the NMOS FET device 540 is connected to the Vng common. 'N' node, which is shared by all of the parallel connected protection circuits of this invention. Device 540 is normally off during normal operations when there is no ESD high voltage or high current situation.

FIG. 5 also shows a PN diode 520 whose p-side is connected to the zapped. I/O pad 510 & whose N side is connected to the Vcc power supply 585. The PN diode 520 conducts only when the voltage at the I/O pad 510 exceeds Vcc and Vbe where Vbe is a diode voltage drop of about 0.7 volts. The voltage at a zapped I/O pin 510 is clamped to Vcc and Vbe. During this high voltage damped state NMOS FET device 540 is 'ON' and conducting ESD current to ground. Node 565 is high due to AC current through the active resistor made up of the NMOS FET device 570, coupling from node 510 to node 565 via Cds 541 and NMOS device 540. Since node Vpg 531 goes low, NMOS device 570 will eventually turn off. This further enhances the high level at node Vng 565. Node 565 goes high and stays high for a time period since the parasitic capacitance Cgs 571 of NMOS FET device 580 charges up. This charged up high voltage turns on NMOS device 560 which provides another parallel path for ESD current to flow to ground via the 1 kilohm resistor 550. This current flow through the turned on NMOS FET 560 to ground 575 produces a low level at the Vpg node. The low level at node Vpg 531 turns on PMOS FET 590. In addition, the previously mentioned current flow through the 1 kilo ohm resistor 570 causes a high voltage level at the Vng node 565. This high level at Vng 565 turns on the NMOS FET 580. Therefore a third parallel ESD current discharge path to ground is established through devices 590 and 580. Nodes Vpg and Vng are nodes which are shared by all of the parallel ESD protection circuits like the one in FIG. 5. All of the ESD protection circuits associated with the unzapped I/O pads provide several parallel paths to ground for the ESD current to discharge. This quick discharging of the ESD current to ground protects the whole chip from ESD overcurrent damage.

In summary, a positive ESD voltage spike causes the capacitive charging of Vng to turn on both PMOS 530 and NMOS 540 devices in the zapped and unzapped protection circuits. A negative ESD voltage spike is clamped by the PN diode 520 at the zapped I/O pin. The PMOS 530 and NMOS 540 devices are off and the unzapped protection circuits are off.

The advantage of this invention is the ability to create a parallel discharge path to ground in order to discharge the damaging ESD current quickly so as to avoid circuit damage. The two circuit embodiments show how the protection circuits of this invention at both the unzapped I/O pads and the zapped I/O pad are connected in a parallel circuit for discharging ESD currents quickly. These protection embodiments require a small amount of semiconductor area, since the smaller protection circuits are distributed and placed at the locations of each I/O pad.

While this invention has been particularly shown and described with Reference to the preferred embodiments thereof, it will be understood by those Skilled in the art that various changes in form and details may be made without Departing from the spirit and scope of this invention.

What is claimed is:

1. A whole chip electrostatic discharge, ECD, first embodiment circuit comprising:
   a PN diode whose p-side connects to the input/output, I/O pad to be protected and whose N-side is connected to Vcc supply voltage,
   a PMOS FET plus NMOS FET 2-device input stage connected between Vcc and Vss,
   a resistor plus NMOS FET first mid stage connected between Vcc and Vss (ground),
   a resistor to ground second mid-stage, and
   a PMOS FET plus NMOS FET output stage connected between Vcc and Vss (ground) whose input connects from the mid stages and whose output drives an unused I/O pad.

2. The whole chip ESD protection circuit of claim 1 wherein said input stage contains said PN diode whose P-side is connected to the I/O pad to be protected and whose N-side is connected to Vcc.

3. The whole chip ESD protection circuit of claim 1 wherein said input stage contains said p-channel metal oxide semiconductor field effect transistor PMOS FET whose source is connected to Vcc and is common to the N-side of said PN diode, whose drain is connected in common with the p-side of said PN diode, and to the drain of said NMOS FET in the input stage, and whose gate is connected to said mid stage circuit.

4. The whole chip ESD protection circuit of claim 1 wherein said input stage contains said n-channel metal oxide semiconductor field-effect transistor NMOS FET whose source is connected to Vss or ground, whose drain is connected in common with said p-side of said PN diode and in common with said I/O pad to be protected and in common with said drain of said PMOS FET in said input stage, and whose gate is connected to said mid stage circuit.

5. The whole chip ESD protection circuit of claim 1 wherein said first mid-stage contains an NMOS FET whose source is connected to ground, whose drain is connected to said gate of said PMOS FET of said input stage and is connected to said resistor of this $1^{st}$ mid stage and is connected to said output stage.

6. The whole chip ESD protection circuit of claim 1 wherein said first mid-stage contains a resistor connected between said VCC power supply and said drain of said NMOS FET.

7. The whole chip ESD protection circuit of claim 1 wherein said second mid-stage contains a resistor connected between Vss or ground and between the gate of said NMOS FET in said first mid-stage, the gate of said NMOS FET of said first stage, and which is connected to the input of said output stage.

8. The whole chip ESD protection circuit of claim 1 wherein said output stage contains said PMOS FET whose source is connected to Vcc, whose drain is connected to an unzapped I/O pad, and to the drain of said NMOS FET in the output stage, and whose gate is connected to said gate of said PMOS FET in said input stage and connected to said drain of said NMOS FET in said input stage.

9. The whole chip ESD protection circuit of claim 1 wherein said output stage contains said NMOSFET whose source is connected to Vss or ground, whose drain is connected to an unzapped I/O pad and connected to said drain of said PMOS FET in said output stage and whose gate is connected to said NMOS FET of said input stage and to one side of said resistor in said $2^{nd}$ mid-stage and connected to said gate of said NMOS FET of said first mid-stage.

10. The whole chip ESD protection circuit of claim 1 wherein several said first embodiment circuits (one for each I/O pad) are tied in parallel between Vcc and ground, in order to sink large ESD charge and current.

11. The whole chip ESD protection circuit of claim 1 wherein a drain to source intrinsic capacitor, Cds, of said NMOS FET in said input stage is used to couple charge from said zapped I/O pad to said input to said output stage.

12. The whole chip ESD protection circuit of claim 1 wherein said charge coupled through said intrinsic capacitance, Cds, of said NMOS FET of said input stage charges up an intrinsic capacitance, Cgs, of said NMOS FET of said output stage.

* * * * *